INVENTORS
WARREN C. ROSVOLD
WILHELM H. LEGAT
BY [signature]
AGENT

INVENTORS
WARREN C. ROSVOLD
WILHELM H. LEGAT
BY [signature]
AGENT

United States Patent Office 3,447,235
Patented June 3, 1969

3,447,235
ISOLATED CATHODE ARRAY SEMICONDUCTOR
Warren C. Rosvold, Sunnyvale, and Wilhelm H. Legat, Woodside, Calif., assignors to Raytheon Company, Lexington, Mass., a corporation of Delaware
Filed July 21, 1967, Ser. No. 655,082
Int. Cl. B01j *17/00;* H01l *3/00, 7/00*
U.S. Cl. 29—578 8 Claims

ABSTRACT OF THE DISCLOSURE

A method of making an array of isolated semiconductor cathodes on a common anode by employing a single photoresist operation to achieve simultaneous front and back alignment of masks for production of anode windows for selective diffusion on one side and for defining areas for etching of isolated cathodes on the opposite side.

*Background of the invention*

This invention relates to semiconductor devices and has particular reference to a novel method of making semiconductor devices such as semiconductor diodes on a high production basis.

In the conventional manner of manufacturing semiconductor diodes or cathodes on a single common anode, it has been the usual practice to employ two or more separate photoresist or other masking operations to define the individual diffusion areas where contacts between the anode and cathodes are to be made through a dielectric layer and to define the individual diode configurations to be etched. Such conventional techniques also involve the steps of lapping selected areas of the semiconductor device to provide them with uniplanar surfaces, and polishing to obtain surfaces which yield a uniform oxide when deposited for insulation purposes, as well as plural oxidation and masking steps to outline the individual cathode areas, which steps entail critical front-to-back alignment methods for achieving proper and necessary registration with the anode.

*Summary of the invention*

The above and other disadvantages of the prior art are overcome in the present invention by the provision of a novel method which embodies only a single photoresist or other masking step in the production simultaneously of a plurality of semiconductor cathodes on a common anode, which step achieves accurate front and back alignment for subsequent production of anode windows for selective diffusion on one side and simultaneously achieves accurate definition of cathodes to be subsequently etched on the opposite side of the device.

*Description of the preferred embodiment*

Figure 1:
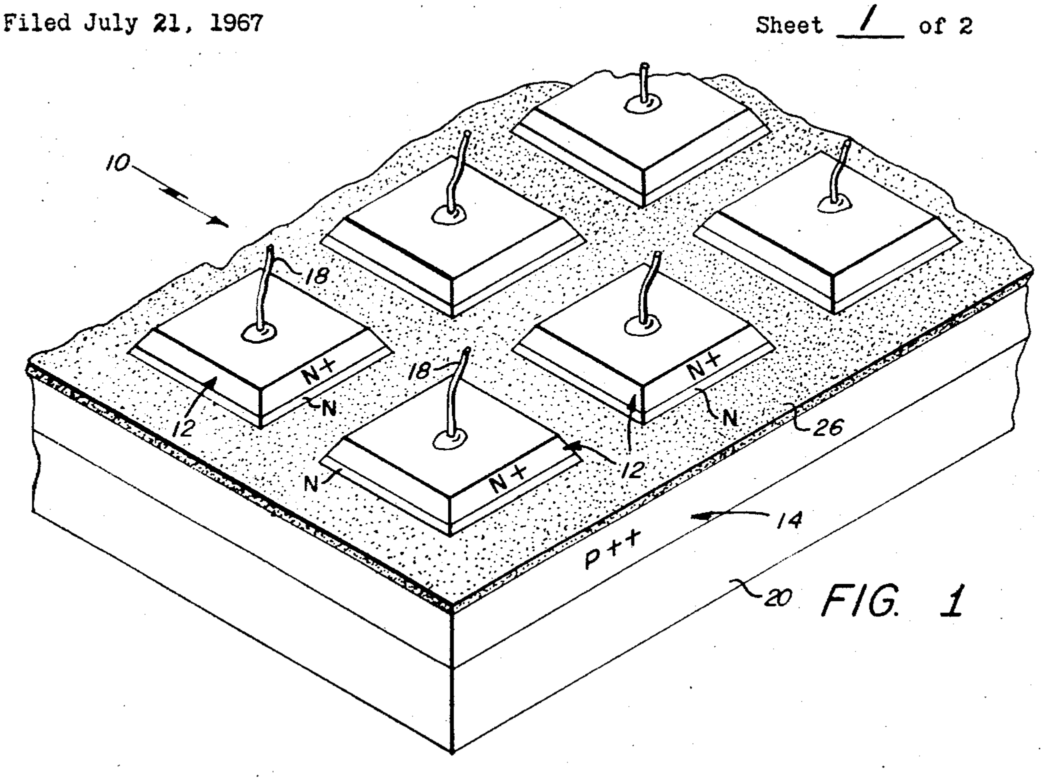
FIG. 1 is an isometric view of a device embodying a number of semiconductor diodes formed in accordance with the present invention.

Referring to the drawings, and particularly to FIG. 1, there is shown a structure which includes wafer 10 having a predetermined number of semiconductor diodes comprising separate spaced individual upstanding cathodes 12 shaped as islands or mesas mounted upon a common anode substrate 14. The wafer 10, after the cathodes 12 have been fabricated, may thereafter be scribed and separated into individual sets of isolated cathode units each of which constitutes a matrix of the desired number of devices on a single substrate.

The cathode islands 12 are illustrated as being of N-type silicon and are electrically separated from the P-type anode 14 by an insulating oxide layer 26 which is apertured at selected locations, in accordance with one aspect of this invention, so as to provide a P-N junction at each aperture where physical contact is made by each individual cathode 12 with the anode 14. As shown, leads 18 are suitably bonded to each cathode and the anode 14 is die attached at 20 on its side opposite the cathodes to provide means for supplying suitable electrical bias to the device.

It is to be understood that although the following description refers to a device wherein the anode 14 is of P-type material and the cathodes 12 are of N-type conductivity, it will be apparent that the reverse may be the case, whereby the anode is N-type and the cathodes are P-type, with suitable biasing being provided accordingly to achieve an operative device as is well known.

Figure 2:
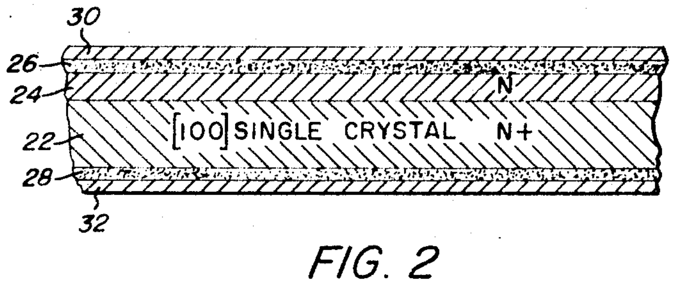
FIGS. 2–6 are diagrammatic views illustrating various steps employed during the process of fabricating the device of FIG. 1.

In the manufacture of a semiconductor device of the type shown in FIG. 1, there is provided a silicon chip or wafer 22 (FIG. 2) which preferably has a resistivity of about .01 ohm cm. and less than about 2000 dislocations per sq. cm. The wafer 22 is sliced from a crystal ingot in the [100] plane and a flat is ground in the [110] plane for use in alignment in the proper crystallographic orientation which is necessary for the etch process, to be hereinafter described.

The wafer 22 is suitably doped in any well-known manner to provide it with the selected N- or P-type conductivity characteristics and of such concentration of dopant as will provide the desired resistivity of from about .005 to .015 ohm cm., whereby the conductivity may be termed as N+ or P+. This wafer will eventually become the cathodes 12 of the device shown in FIG. 1. The wafer is processed by conventional methods to a desired resultant size, such as about 6 mils thick and 1 inch in diameter, for example.

Upon one side of the N+ wafer 22 is epitaxially deposited an N-type layer 24 of required resistivity and thickness for device requirements. For example, layer 24 may be about 14–16 microns in thickness and have a resistivity of about 3–5 ohms cm. Layer 24 is a single crystal epitaxy formed by reacting a silicon compound such as silicon tetrachloride, silane or tetraorthosilicate with a reducing compound, such as hydrogen, for example, in vapor form onto wafer 22 in a furance at about 800–1200° C. for about 8–15 minutes to produce a thickness of 14–16 microns. Layer 24 is doped with arsenic, antimony, phosphorus or other N-type dopant in an amount sufficient to provide it with a resistivity of about 3–5 ohms cm. However, other thicknesses and amounts of doping may be employed to provide a desired resistivity in accordance with the device requirements.

The wafer 22 having layer 24 thereon is then prepared to receive a polycrystalline deposition on one side and to be suitably etched on the other side by oxidizing the opposed surfaces of the structure, whereupon the structure is coated upon opposite surfaces with layers 26 and 28 of silicon dioxide, this being done by any of the known thermal growing or other oxidation techniques to form the oxide film to a thickness of about from 2 to 4 microns. Both oxide coated surfaces of the wafer are then coated with a photoresist material such as the solution known as KPR, sold under that terminology by Eastman-Kodak Company, for example.

The wafer thus is oxidized with the layers 26 and 28 of silicon dioxide, and these oxide layers are masked with layers 30 and 32 of photoresist which are provided in predetermined patterns so as to define on one side the areas to which individual cathodes are to be joined electrically with a subsequently deposited polycrystalline silicon substrate, and to define on the other side the areas in which active mesas or cathode islands are to be formed, as will become apparent from the following description.

The particular technique for forming the masks on the oxide layers is not in itself unique insofar as this invention is concerned and, therefore, will be only briefly described herein. Photographic films are prepared with desired patterns thereon, and the wafer is provided with coatings 30 and 32 of photoresist material, such as KPR, which overlies the silicon dioxide layers 26 and 28 respectively. Coatings 30 and 32 are exposed through the films to ultraviolet or other radiation to which they are sensitive, and developing then takes place by dipping the wafer in a solution such as trichloroethylene to remove unsensitized KPR. The structure is then baked at about 150° C. for about 10 minutes, whereupon the oxide layers support thereon respective resultant hardened photoresist masks having the desired configurations or patterns.

Such masks have what may be termed "window" areas through which the silicon dioxide is exposed. The silicon dioxide is then removed in the exposed window areas of the photoresist pattern. This is done by placing the structure in a solution containing about 1 part of hydrofluoric acid and 9 parts of ammonium fluoride to etch away the exposed area of silicon dioxide, following which it is rinsed in water and dried. The remaining photoresist is now removed by a solution of 1 part sulphuric acid and 9 parts nitric acid at about 100° C. for about 10 minutes.

Figure 3:
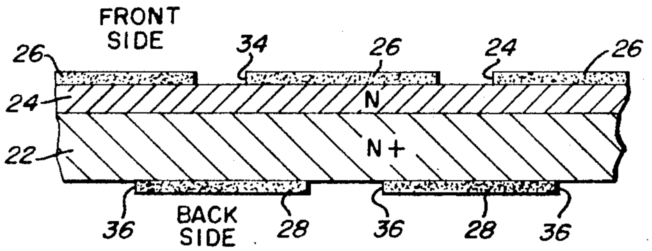

At this stage, the structure appears substantially as shown in FIG. 3 wherein oxide layer 26 is provided with a number of windows 34 corresponding to the number of cathodes 12 to be formed on the wafer. On the opposite side of the wafer, oxide coating 28 is likewise provided with a number of windows 36 in the areas where etching is to take place during subsequent formation of the individual cathodes.

It is important to note here that the photoresist, masking and oxide removal steps are performed simultaneously on both sides of the structure and that the masks are prealigned so that the windows 34 will be located at the geometric centers of the subsequently formed cathodes and are perfectly aligned with respect to the windows 36 on the opposite side of the structure so that, when the cathodes are subsequently etched, such etching will form precisely shaped cathodes which are perfectly aligned with respect to the window areas 34 and, consequently, with respect to P-N junctions to be formed between each cathode and a common anode to be deposited over the oxide layer 26.

Figure 4:
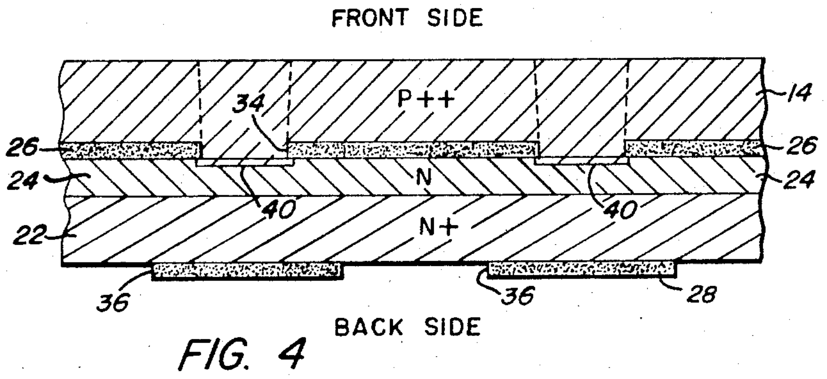

At this point, a polycrystalline silicon deposit is grown on the structure in overlying relation to oxide layer 26 to provide the common anode substrate 14. For purposes of identification, this side of the structure hereinafter will be referred to as the front or first side and the opposite side will be referred to as the back or second side. As shown in FIG. 4, the newly formed P-layer 14 overlies oxide layer 26 and extends through windows 34 into physical contact with the exposed surface of N-layer 24. The P-type material actually diffuses slightly into the P-layer 14 and forms P-N junctions 40 between layers 14 and 24, as clearly shown in FIG. 4.

P-layer 14 is polycrystalline type silicon of low resistivity, such as about .001 ohm cm., and serves as a dopant which forms the P-N junction, and also serves as a support media for wafer handling after the cathodes are subsequently etched. The layer 14 is essentially polycrystalline but contains areas within and overlying the windows 34 which are single crystal in structure. While shown and described herein as P-type, this layer 14 is of opposite conductivity type to the epitaxial layer 24, and is insulated from layer 24 throughout most of its area by the oxide 26. Layer 14 is about 0.002 to 0.003 inch in thickness and is preferably deposited on the wafer by vapor-deposition. This may be done by placing the structure of FIG. 3 in a furnace which is brought to a temperature of about from 950° C. to 1200° C., at which time silicon tetrachloride, silane or tetraorthosilicate is reacted with a reducing compound such as hydrogen onto the front side of the structure over oxide coating 26. This process is well known and may be provided in a single step or in multiple steps, as desired. During the process, boron or other selected P-type dopant is introduced to provide layer 14 with about $10^{20}$ atoms per cubic cm. of boron. The resultant P-N junctions are completely embedded within the material of the device and thus cannot be disadvantageously affected by environmental conditions such as nuclear or electromagnetic radiation.

At this point, the separate cathodes 12 are formed by a preferential etching technique which precisely provides a number of mesas with inclined walls located in precise relationship with respect to the P-N junctions 40. Such a precise etching technique is described in my copending U.S. patent application Ser. No. 520,506, filed Jan. 13, 1966, and assigned to the same assignee as the present application.

Briefly, this technique comprises providing an etching solution which is a saturated solution of sodium hydroxide (NaOH) in water. Saturation for etching purposes occurs with at least 25% of the mixture being NaOH. For best results, the solution should contain about 33% of NaOH to compensate for dilution or other weakening of the etchant during the etching process.

The wafer to be etched is masked on the front side with etchant resistant material, such as an oxide or wax, and is then preheated in boiling water and placed in the etchant which is at a temperature of about 115° C. The preheated wafer is subjected to the etchant for the time necessary to etch the mesas to remove areas of layers 22 and 24 down to the silicon dioxide layer 26. This etching occurs automatically through the windows 36 which were previously located and formed in the oxide layer 28 on the back side of the wafer by the single mask technique in accordance with this invention as described hereinbefore The etching proceeds automatically in the [100] direction of the single crystal material of layers 22 and 24, parallel to the [111] planes.

Material removal provides the mesas with inclined side walls since etching does not occur perpendicular to the top surface because of the immediate interception of the [111] faces which are at an angle of 54.7° with the surface plane which is [100]. The reason negligible etching takes place into the [111] faces is that the [111] lattice is the more dense. Therefore, etching is preferential into the less dense [100] planes.

It has been found that with the windows 36 in the silicon dioxide mask layer 28 properly aligned within about 5° of the crystal planes, mesa structures can be formed having linear or plane walls with a deviation of about 30° from perpendicular.

The silicon dioxide mask is not substantially affected by sodium hydroxide during the etching process. The oxide also is not undercut to any substantial degree, such undercutting being less than two microns per 25 microns of depth.

The time and temperature cycles may be varied somewhat to produce predetermined etching depths as pointed out in the aforementioned copending application.

To complete the process, the device is removed from the etching solution at the conclusion of the selected time interval and is rinsed in deionized water, any remaining NaOH is neutralized by a solution of acetic acid, followed by final rinsing and drying.

Figure 5:
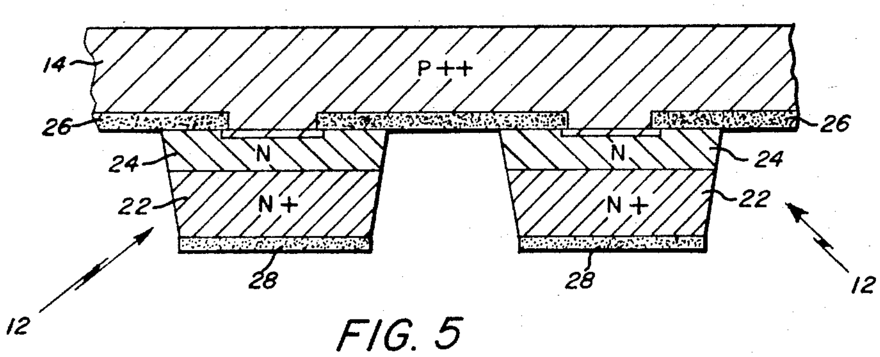
Figure 6:
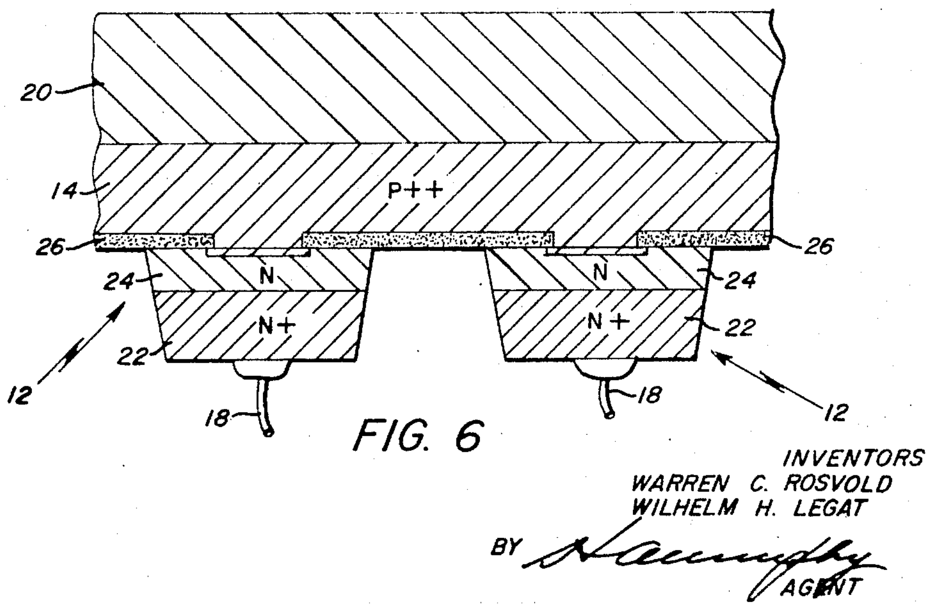

After the etching process is completed the device appears substantially as shown in FIG. 5. At this point, the mesa tops are lapped to remove the oxide deposits 28.

Now the wafer is scribed and separated into individual sets of isolated cathode units which constitute a matrix of the desired number of devices on a single substrate. Each unit is then conventionally die attached on its common anode side with the contact 20 (FIG. 1) and lead bonds 18 are provided to the isolated cathodes. These steps may be performed by known techniques.

From the foregoing description it will be seen that an improved and novel process or method has been set forth whereby a multiplicity of semiconductor mesa diodes are formed with only a single photoresist handling operation to achieve complete device geometry, thus eliminating several process steps required to achieve the same or similar results by known methods.

What is claimed is:

1. A method of making a semiconductor device comprising simultaneously depositing first and second etchant resistant masks upon opposite first and second broad surfaces of a chip of semiconductor material of predetermined conductivity type and resistivity, with said first mask having a window therein defining the location of a diffused area to be subsequently formed, and the second mask having windows precisely aligned with respect to the window in the first mask and defining areas of the chip which are to be subsequently etched during the formation of a cathode, depositing a layer of semiconductor material of conductivity type opposite that of the chip upon said first side of the chip in a manner whereby said layer extends through the window in said first mask and forms a P-N junction with said chip through said window, with said layer forming an anode for the cathode to be formed, and preferentially etching the second side of the chip through the windows thereon completely through the chip and down to the insulating layer to provide a cathode which communicates with the anode only through the P-N junction.

2. A method of making a semiconductor device comprising applying an insulating coating upon the opposite broad surfaces of a chip of semiconductor material of predetermined conductivity type and resistivity, masking said insulating layers with etch resistant material with the mask on the first side of the chip having a window therein defining the location of a diffused area to be subsequently formed, and on the second side of the chip having windows precisely aligned with respect to the window in the first mask and defining areas of the chip which are to be subsequently etched during the formation of a cathode, removing the insulating coating within the window areas, depositing a layer of semiconductor material of conductivity type opposite that of the chip upon said first side of the chip in a manner whereby said layer extends through the window in said first mask and forms a P-N junction with said chip through said window, with said layer forming an anode for the cathode to be formed, and preferentially etching the second side of the chip through the windows thereon completely through the chip and down to the insulating layer to provide a cathode which communicates with the anode only through the P-N junction.

3. A method set forth in claim 2 wherein said masking step comprises depositing the etch resistant material on the second side of the wafer so that the edges of the windows therein are aligned parallel with the [110] crystal planes of the wafer, and said etching occurs in the [100] direction.

4. The method set forth in claim 3 wherein said step of depositing the opposite conductivity type layer upon the first side of the wafer is done by epitaxial deposition.

5. A method of making an array of isolated semiconductor cathodes on a common anode comprising simultaneously depositing first and second etchant resistant masks upon opposite first and second broad surfaces of a wafer of semiconductor material of predetermined conductivity type and resistivity, with said first mask having windows therein defining the locations of subsequent diffused areas to be formed, and the second mask having windows precisely aligned with respect to the windows in the first mask and defining areas of the wafer which are to be subsequently etched during the formation of isolated cathodes, depositing a layer of semiconductor material of conductivity type opposite that of the wafer upon said first side of the wafer in a manner whereby said layer extends through the windows in said first mask and forms P-N junctions with said wafer through each of said windows, with said layer forming a common anode for all of the cathodes to be formed, preferentially etching the second side of the wafer through said second windows completely through the wafer and down to the said first mask to provide a number of separate cathodes each of which communicates with the common anode only through a respective P-N junction, and separating said wafer into a number of units each of which contains a selected number of cathodes on a common anode.

6. A method of making an array of isolated semiconductor cathodes on a common anode comprising applying an insulating coating upon the opposite broad surfaces of a wafer of semiconductor material of predetermined conductivity type and resistivity, masking said insulating layers with etch resistant material with the mask on the first side of the wafer having windows therein defining the locations of subsequent diffused areas to be formed, and on the second side of the wafer having windows precisely aligned with respect to the first windows and defining areas of the wafer which are to be subsequently etched during the formation of isolated cathodes, removing the insulating coating within the window areas, depositing a layer of semiconductor material of conductivity type opposite that of the wafer upon said first side of the wafer in a manner whereby said layer extends through the windows thereon and forms P-N junctions with said wafer through each of said windows on said first side of the wafer, with said layer forming a common anode for all of the cathodes to be formed, preferentially etching the second side of the wafer through the windows thereon completely through the wafer and down to the insulating layer to provide a number of separate cathodes each of which communicates with the common anode only through a respective P-N junction, and separating said wafer into a number of units each of which contains a selected number of cathodes on a common anode.

7. The method of making an array of isolated semiconductor cathodes as set forth in claim 6 wherein said masking step comprises depositing the etch resistant material on the second side of the wafer so that the edges of the windows therein are aligned parallel with the [110] crystal planes of the wafer, and said etching occurs in the [100] direction.

8. The method of making an array of isolated semiconductor cathodes as set forth in claim 7 wherein said step of depositing the opposite conductivity type layer upon the first side of the wafer is done by epitaxial deposition.

References Cited

UNITED STATES PATENTS

| | | | |
|---|---|---|---|
| 3,189,973 | 6/1965 | Edwards et al. | |
| 3,288,662 | 11/1966 | Weisberg | 156—11 |

WILLIAM D. BROOKS, *Primary Examiner.*

U.S. Cl. X.R.

29—580; 148—175; 317—234

PO-1050
(5/69)

UNITED STATES PATENT OFFICE
CERTIFICATE OF CORRECTION

Patent No. 3,447,235 Dated June 3, 1969

Inventor(s) Warren C. Rosvold and Wilhelm H. Legat

It is certified that error appears in the above-identified patent and that said Letters Patent are hereby corrected as shown below:

In Column 4, between lines 50 and 51, please insert the following paragraph:

It is to be understood that during the previously described one-step mask formation, that is, the process of masking and etching the oxide layers 26 and 28, the openings or windows 36 in oxide layer 28 are precisely shaped with edges aligned with respect to the crystal planes and particularly with the [110] planes, thus insuring the desired geometry of the etched mesas.

SIGNED AND
SEALED

DEC 2 1969

(SEAL)
Attest:

Edward M. Fletcher, Jr.
Attesting Officer

WILLIAM E. SCHUYLER, JR.
Commissioner of Patents